United States Patent
Guo et al.

(10) Patent No.: US 12,211,851 B2
(45) Date of Patent: *Jan. 28, 2025

(54) SEMICONDUCTOR DEVICE INCLUDING STANDARD CELLS

(71) Applicant: TAIWAN SEMICONDUCTOR MANUFACTURING COMPANY, LTD., Hsinchu (TW)

(72) Inventors: Ta-Pen Guo, Taipei (TW); Lee-Chung Lu, Taipei (TW); Li-Chun Tien, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/440,499

(22) Filed: Feb. 13, 2024

(65) Prior Publication Data

US 2024/0186326 A1     Jun. 6, 2024

Related U.S. Application Data

(63) Continuation of application No. 17/306,852, filed on May 3, 2021, now Pat. No. 11,935,893, which is a (Continued)

(51) Int. Cl.
    *H01L 27/118*           (2006.01)
    *H01L 27/02*            (2006.01)
    (Continued)

(52) U.S. Cl.
    CPC .... *H01L 27/11807* (2013.01); *H01L 27/0207* (2013.01); *H01L 27/0924* (2013.01);
    (Continued)

(58) Field of Classification Search
    CPC .......... H01L 27/11807; H01L 27/0207; H01L 27/0924; H01L 29/6681; H01L 29/785;
    (Continued)

(56) References Cited

U.S. PATENT DOCUMENTS 6,054,872 A     4/2000    Fudanuki et al.
9,461,044 B1   10/2016   Chang et al.
(Continued)

FOREIGN PATENT DOCUMENTS

CN        1495895 A     5/2004
CN     101937912 A     1/2011
(Continued)

OTHER PUBLICATIONS

Office Action issued Apr. 29, 2019 in corresponding Taiwanese Patent Application No. 107129674.
(Continued)

*Primary Examiner* — Changhyun Yi
(74) *Attorney, Agent, or Firm* — STUDEBAKER & BRACKETT PC

(57) ABSTRACT

A semiconductor device includes a plurality of standard cells. The plurality of standard cells include a first group of standard cells arranged in a first row extending in a row direction and a second group of standard cells arranged in a second row extending in the row direction. The first group of standard cells and the second group of standard cells are arranged in a column direction. A cell height of the first group of standard cells in the column direction is different from a cell height of the second group of standard cells in the column direction.

20 Claims, 12 Drawing Sheets

Related U.S. Application Data continuation of application No. 16/712,356, filed on Dec. 12, 2019, now Pat. No. 10,998,340, which is a continuation of application No. 15/940,191, filed on Mar. 29, 2018, now Pat. No. 11,011,545.

(60) Provisional application No. 62/586,070, filed on Nov. 14, 2017.

(51) Int. Cl.
  *H01L 27/092* (2006.01)
  *H01L 29/66* (2006.01)
  *H01L 29/78* (2006.01)

(52) U.S. Cl.
  CPC .............. *H01L 29/6681* (2013.01); *H01L 2027/11812* (2013.01); *H01L 2027/11814* (2013.01); *H01L 2027/11816* (2013.01); *H01L 2027/11855* (2013.01); *H01L 29/785* (2013.01)

(58) Field of Classification Search
  CPC . H01L 2027/11812; H01L 2027/11814; H01L 2027/11816; H01L 2027/11855
  See application file for complete search history.

(56) References Cited

U.S. PATENT DOCUMENTS

| | | | |
|---|---|---|---|
| 9,613,953 | B2 | 4/2017 | Liaw |
| 9,691,672 | B1 | 6/2017 | Lam et al. |
| 9,825,024 | B2 | 11/2017 | Jung |
| 10,998,340 | B2 | 5/2021 | Guo et al. |
| 2004/0031995 | A1 | 2/2004 | Maeno et al. |
| 2005/0198604 | A1 | 9/2005 | Yoshida et al. |
| 2006/0138464 | A1* | 6/2006 | Shimamura ........... G06F 30/392 257/E27.108 |
| 2007/0284619 | A1 | 12/2007 | Kanno et al. |
| 2009/0174451 | A1 | 7/2009 | Pasqualini |
| 2011/0272776 | A1 | 11/2011 | Omura |
| 2012/0001232 | A1 | 1/2012 | Liaw |
| 2012/0249182 | A1 | 10/2012 | Sherlekar |
| 2012/0286331 | A1 | 11/2012 | Aton et al. |
| 2013/0285049 | A1 | 10/2013 | Ohmaru et al. |
| 2013/0313615 | A1 | 11/2013 | Tzeng et al. |
| 2014/0181774 | A1 | 6/2014 | Hatamian et al. |
| 2014/0183646 | A1 | 7/2014 | Hatamian et al. |
| 2015/0048424 | A1 | 2/2015 | Tien et al. |
| 2015/0123730 | A1 | 5/2015 | Yang |
| 2015/0143309 | A1 | 5/2015 | De Dood et al. |
| 2016/0125116 | A1 | 5/2016 | Liu et al. |
| 2016/0284695 | A1 | 9/2016 | Liaw |
| 2017/0098608 | A1 | 4/2017 | Jung |
| 2017/0098641 | A1 | 4/2017 | Jung |
| 2017/0125416 | A1 | 5/2017 | Baek et al. |
| 2017/0244394 | A1* | 8/2017 | Kim ................ H01L 27/0207 |
| 2017/0277819 | A1 | 9/2017 | Kim et al. |
| 2017/0373090 | A1 | 12/2017 | Correale, Jr. et al. |
| 2018/0006039 | A1 | 1/2018 | Lee et al. |
| 2018/0074117 | A1 | 3/2018 | Salem et al. |
| 2018/0108646 | A1* | 4/2018 | Lee ................ H01L 27/0207 |
| 2018/0210421 | A1 | 7/2018 | Kim et al. |
| 2019/0081029 | A1 | 3/2019 | Okamoto et al. |
| 2019/0096891 | A1 | 3/2019 | Liaw |

FOREIGN PATENT DOCUMENTS

| | | |
|---|---|---|
| CN | 102314931 A | 1/2011 |
| CN | 102237362 A | 11/2011 |
| CN | 104377196 A | 2/2015 |
| CN | 107068754 A | 8/2017 |
| JP | 2014-236116 A | 12/2014 |
| KR | 10-2004-0016403 A | 2/2004 |
| KR | 10-2014-0059911 A | 5/2014 |

OTHER PUBLICATIONS

Non-final Office Action issued in corresponding U.S. Appl. No. 15/940,191, dated Oct. 18, 2018.

Notice of Allowance issued in corresponding U.S. Appl. No. 15/940,191, dated Apr. 11, 2019.

Notice of Allowance issued in corresponding U.S. Appl. No. 16/712,356, dated Jan. 4, 2021.

Non-Final Office Action issued in corresponding U.S. Appl. No. 16/712,356, dated Jan. 4, 2021.

Non-Final Office Action issued in U.S. Appl. No. 17/306,852, dated Jul. 21, 2023.

Notice of Allowance issued in U.S. Appl. No. 17/306,852, dated Nov. 14, 2023.

* cited by examiner

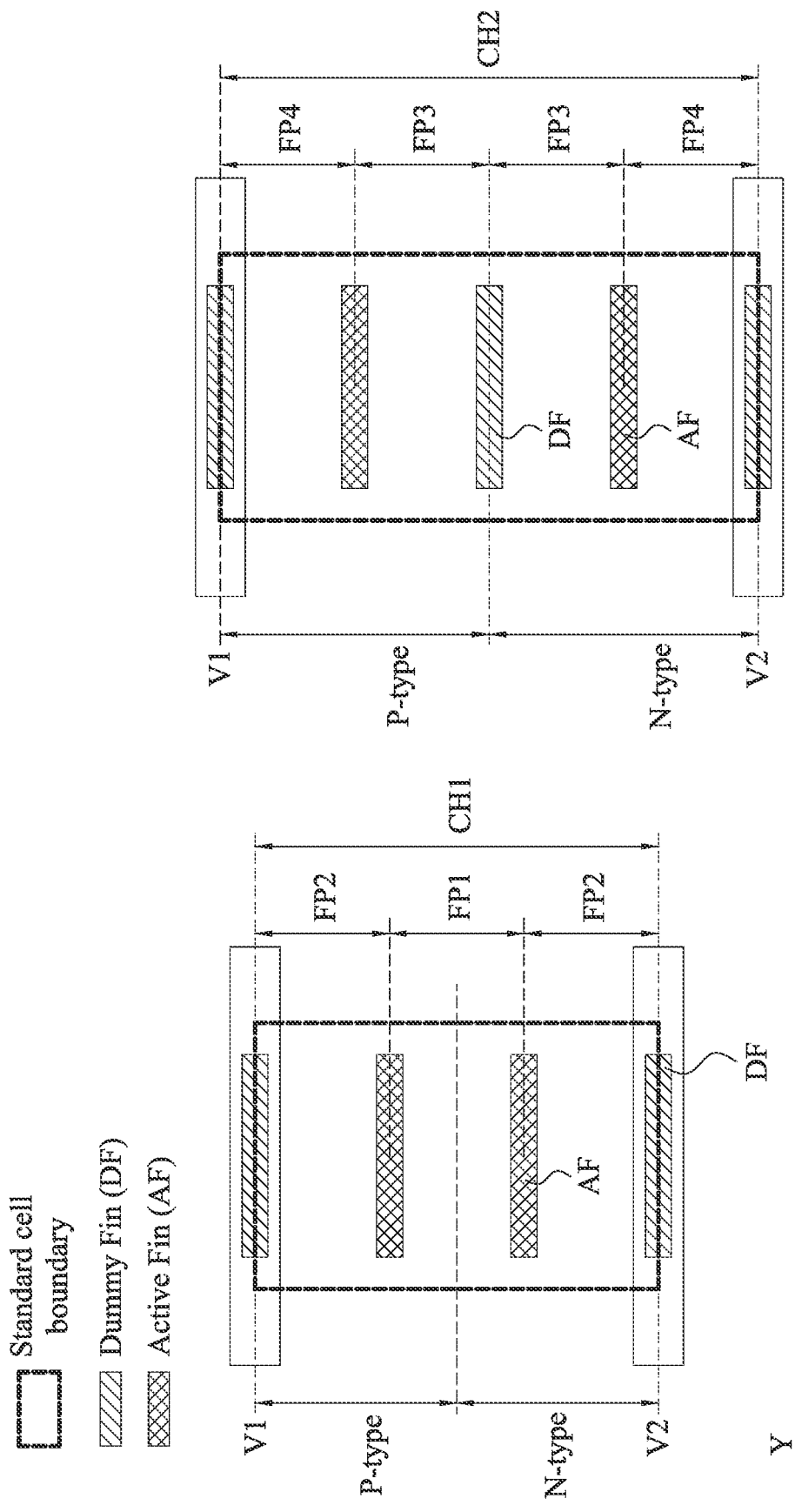

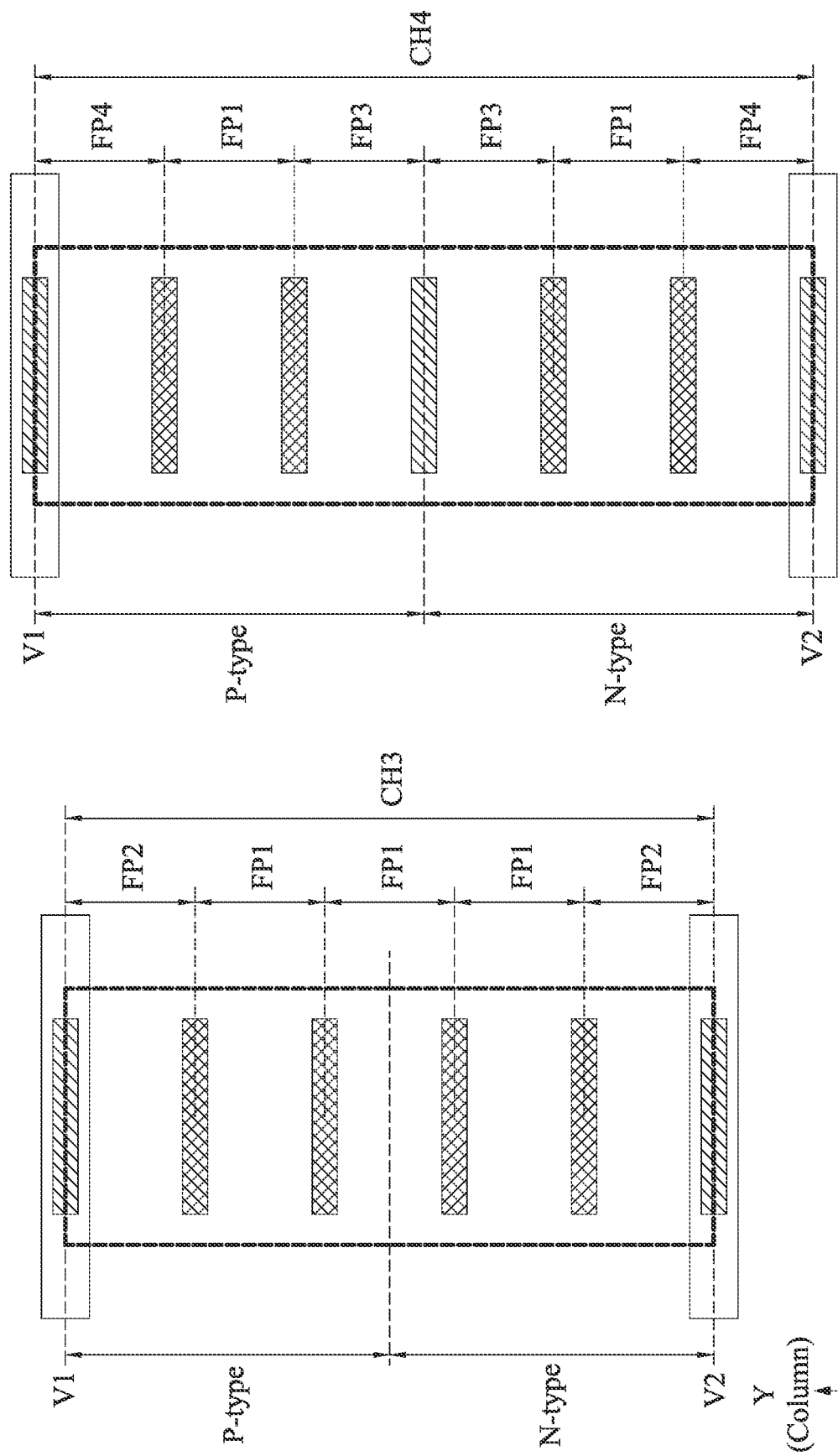

| Case # | Number of fins in P and N regions (P, N) in a given row | Number of fins in P and N region adjacent row | Cell height ratio | Total cell height of two rows |
|---|---|---|---|---|
| 1 | (1, 1) (cell height =CH0) | (2, 2) | 1:2 | $3CH_0$ |
| 2 | (2, 2) | (3, 3) | 2:3 | $5CH_0$ |
| 3 | (1, 1) | (3, 3) | 1:3 | $4CH_0$ |
| 4 | (2, 2) | (4, 4) | 2:4 (=1:2) | $6CH_0$ |
| 5 | (2, 1) | (2, 2) | 1.5: 2 (=3:4) | $3.5CH_0$ |
| 6 | (2, 1) | (1, 1) | 1.5: 1 (=3:2) | $2.5CH_0$ |
| 7 | (3, 2) | (2, 2) | 2.5: 2 (=5:4) | $4.5CH_0$ |
| 8 | (3, 2) | (2, 1) | 2.5: 1.5 (=5:3) | $4CH_0$ |
| 9 | (3, 2) | (1, 1) | 2.5: 1 (=5:2) | $3.5CH_0$ |
| 10 | (1, 1) | (1, 1) | 1:1 | $2CH_0$ |
| 11 | (2, 2) | (2, 2) | 2:2 (=1:1) | $4CH_0$ |

Fig. 8

SEMICONDUCTOR DEVICE INCLUDING STANDARD CELLS

RELATED APPLICATIONS

This application is a Continuation of U.S. application Ser. No. 17/306,852, filed May 3, 2021, which is a Continuation of U.S. application Ser. No. 16/712,356, now U.S. Pat. No. 10,998,340, filed Dec. 12, 2019, which is Continuation of U.S. application Ser. No. 15/940,191, now U.S. Pat. No. 11,011,545, filed Mar. 29, 2018, which claims priority to U.S. Provisional Patent Application No. 62/586,070 filed on Nov. 14, 2017, the entire disclosures of which are incorporated herein by reference.

TECHNICAL FIELD

This application relates to semiconductor devices including a plurality of standard cells and standard cell layout technologies.

BACKGROUND

Today, integrated circuits are designed by placing various standard cells with different functions. For example, standard cells can be logic gates, such as an AND gate, an OR gate, an XOR gate, a NOT gate, a NAND gate, a NOR gate, and an XNOR gate, and combinational logic circuits such as a multiplexer, a flip-flop, an adder, and a counter. Standard cells can be implemented to realize complex integrated circuit functions. For convenience of integrated circuit design, a library including frequently used standard cells with their corresponding layouts are established. Therefore, when designing an integrated circuit, a designer can select desired standard cells from the library and places the selected standard cells in an automatic placement and routing block, such that a layout of the integrated circuit can be created. For example, when designing an integrated circuit having specific functions, standard cells are selected from a pre-designed standard cell library. Next, designers, or EDA (Electronic Desgin Automation) or ECAD (Electronic Computer-Aided Design) tools draw out design layouts of the integrated circuit including the selected standard cells and/or non-standard custom cells. The design layouts are converted to photomasks. Then, semiconductor integrated circuits can be manufactured, when patterns of various layers, defined by photography processes with the photomasks, are transferred to a substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A and 5B show standard cell structures according to embodiments of the present disclosure.

FIGS. 6A and 6B show standard cell structures according to embodiments of the present disclosure.

FIG. 8 shows a table illustrating combinations of various standard cells.

DETAILED DESCRIPTION

Figure 1:
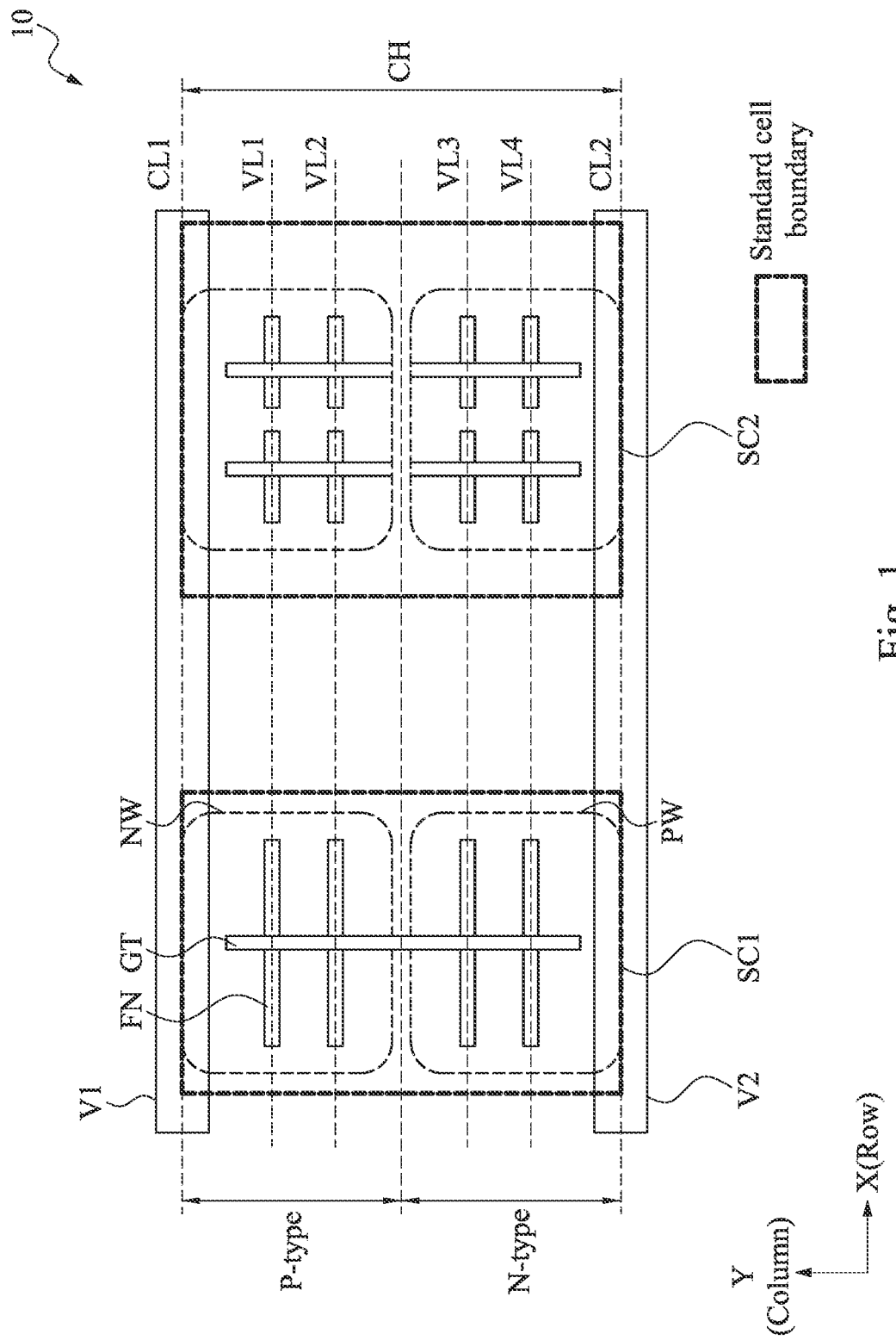
FIG. 1 shows a standard cell structure relating to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In the present disclosure, a phrase "one of A, B and C" means "A, B and/or C" (A, B, C, A and B, A and C, B and C, or A, B and C), and does not mean one element from A, one element from B and one element from C, unless otherwise described. In the present disclosure, a layer, a pattern, or a structure extending in one direction means that a dimension of the layer, the pattern, or the structure in the extended one direction is greater than another dimension of the layer, the pattern, or the structure in another dimension substantially perpendicular to the extended one direction.

It should be understood that in the present disclosure, one pattern/layer/structure/surface/direction being substantially perpendicular to another pattern/layer/structure/surface/direction means that the two patterns/layers/structures/surfaces/directions are perpendicular to each other, or the two patterns/layers/structures/surfaces/directions are intended to be configured to be perpendicular to each other but may not be perfectly perpendicular to each other due to design, manufacturing, measurement errors/margins caused by unperfected manufacturing and measurement conditions. Such a description should be recognizable to one of ordinary skill in the art.

It should be understood that in the present disclosure, one pattern/layer/structure/surface/direction being substantially parallel to another pattern/layer/structure/surface/direction means that the two patterns/layers/structures/surfaces/directions are parallel to each other, or the two patterns/layers/structures/surfaces/directions are intended to be configured to be parallel to each other but may not be perfectly parallel to each other due to design, manufacturing, measurement errors/margins caused by unperfected manufacturing and measurement conditions. Such a description should be recognizable to one of ordinary skill in the art.

In the present disclosure, layers/patterns/structures being formed of substantially the same material means that the layers/patterns/structures are formed of the same material or the layers/patterns/structures are originally formed of the same material but can have impurities having the same or different types with the same or different concentrations doped later in order to implement a semiconductor device. Such a description should be recognizable to one of ordinary skill in the art.

In the present disclosure, two layers/patterns/structures being formed on a same level means that the two layers/patterns/structures have a same distance from a reference plane, for example, a surface of a substrate, based on which a semiconductor device is formed, or the two layers/patterns/structures are intended to be configured to have a same distance from a reference plane, for example, a surface of a substrate, based on which a semiconductor device is formed but may not perfectly have the same distance from the reference plane due to design, manufacturing, measurement errors/margins caused by unperfected manufacturing and measurement conditions. Such a description should be recognizable to one of ordinary skill in the art.

In the present disclosure, two layers/patterns/structures being formed on different level means that with consideration of variations/errors caused by, for example, surface roughness, the two layers/patterns/structures have different distances from a reference plane, for example, a surface of a substrate, based on which a semiconductor device is formed.

In the present disclosure, "about" or "approximately" used to describe a value of a parameter means that the parameter is equal to the described value or that the parameter is within a certain range of the described value, when design error/margin, manufacturing error/margin, measurement error etc. are considered. Such a description should be recognizable to one of ordinary skill in the art.

In the present disclosure, two layers/patterns/structures in a cell, a layout of a cell, or a layout of an integrated circuit being described to have a relation with each other, means that corresponding two layers/patterns/structures in a manufactured semiconductor integrated circuit based on the layout of the two layers/patterns/structures of the cell, the layout of the cell, or the layout of an integrated circuit have such a relation with each other. Here, the relation of the two layers/patterns/structures includes, but not limited to, the two layers/patterns/structures being electrically connected to each other, the two layers/patterns/structures being electrically isolated from each other, the two layers/patterns/structures having described relative positions, the two layers/patterns/structures having described relative dimensions, and the two layers/patterns/structures having described relative material constitutions.

In the present disclosure, not every layer of a cell or a layout is depicted in the drawings. One of ordinary skill in the art should understand that the cell or the layout can include more layers to implement functionality of the cell and omitting these layers is merely for convenience of descriptions.

FIG. 1 shows a standard cell structure relating to embodiments of the present disclosure.

Referring to FIG. 1, a semiconductor device 10 includes a plurality of standard cells, for example, a standard cell SC1 and a standard cell SC2. As shown in FIG. 1, the standard cell SC1 and the standard cell SC2 are arranged in one row of the row direction. Although FIG. 1 shows only two standard cells in one row, the number of standard cells arranged in one row may be more than two. Further, although in FIG. 1, the standard cell SC1 and the standard cell SC2 are arranged with a space therebetween, in other embodiments, the standard cell SC1 and the standard cell SC2 are arranged in contact with each other. As explained later, multiple rows of the standard cells are arranged in the column direction (perpendicular to the row direction in a circuit design layout).

Figure 3:
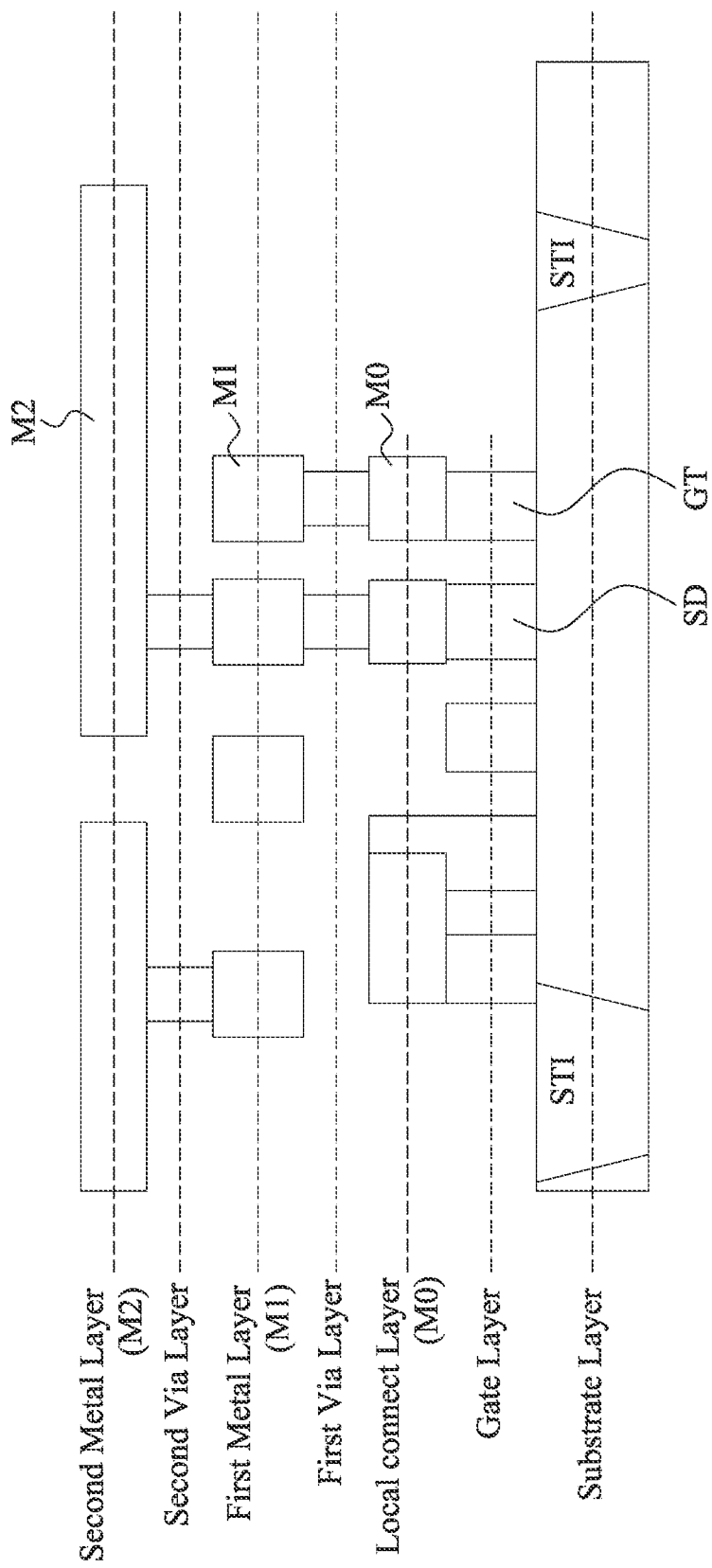
FIG. 3 shows a cross sectional view illustrating vertical layers of a semiconductor device relating to embodiments of the present disclosure.

As shown in FIG. 1, each of the plurality of standard cells SC1 and SC2 includes a first power supply wiring V1 for supplying a first potential and a second power supply wiring V2 for supplying a second potential different from the first potential. The first power supply wiring V1 is VDD (a positive potential) and the second power supply wiring V2 is VSS (e.g., ground) in some embodiments. In some embodiments, the first power supply wiring V1 and the second power supply wiring V2 are formed by a metal layer disposed in a first metal layer M1 as shown in FIG. 3.

A cell height CH of the standard cells SC1 and SC2 is determined based on a distance in the column direction between a center line CL1, extending in the row direction, of the first power supply wiring V1 and a center line CL2, extending in the row direction, of the second power supply wiring V2 as shown in FIG. 1 in some embodiments. In other embodiments, the cell height CH is a pitch of the first power supply wiring V1 and the second power supply wiring V2. One of ordinary skill in the art should understand that one or more standard cells arranged in one row shares the first (second) power supply wiring with one or more standard cell arranged in adjacent rows immediately above or below the one row.

Further, as shown in FIG. 1, each of the standard cells includes complementary metal-oxide-semiconductor (CMOS) logic circuitry and thus includes a p-type region having an n-well NW and an n-type region having a p-well PW.

As shown in FIG. 1, each of the standard cells SC1 and SC2 includes active fin structures FN extending in the row direction. The active fin structures FN are fin structures forming one or more fin field effect transistors (FinFETs). The active fin structures FN extend in the row direction and are arranged in parallel in the column direction. At least one active fin structure FN is arranged in each of the p-type region and the n-type region. In FIG. 1, two active fin structures FN are arranged in each of the p-type region and the n-type region. Further, one or more gate electrodes GT extending in the column direction are disposed over one or more fin structures. Although not shown in FIG. 1, other features, such as a source/drain region, a metal wiring layer, an isolation region and a via are included in the standard cells to realize the intended function of the standard cell.

In the standard cell SC1, two fin structures FN are disposed in each of the p-type region and the n-type region and one gate electrode GT are provided over the four fin structures FN crossing a boundary region between the p-type region and the n-type region. In the standard cell SC2, the gate electrodes GT are physically separated and disconnected at the boundary region between the p-type region and the n-type region. In some embodiments, the gate electrodes GT do not continuously extend into the adjacent standard cell in the column direction.

In a given row, the locations in the column direction at which one or more active fin structures can be disposed are predetermined. For example, the active fin structures FN arranged in the p-type regions are aligned with either one of virtual lines VL1 or VL2 extending in the row direction, respectively, and the active fin structures FN arranged in the n-type regions are aligned with either one of virtual lines VL3 or VL4 extending in the row direction, respectively. No active fin structure not aligned with the virtual lines VL1 or VL2 are allowed. In other words, the active fin structures of the standard cells in the given row are aligned with either one of only N=4 virtual lines VL1-VL4 extending in the row direction, respectively. The minimum number of N is two. In some embodiments, the number of active fin structures for the p-type regions is equal to the number of active fin structures for the n-type regions. When the number N is odd number, the number of active fin structures for the p-type regions is different from the number of active fin structures for the n-type regions. In some embodiments, one or more of the fin structures are not aligned with the virtual lines VL1, VL2, VL3 and/or VL4.

Figure 2:
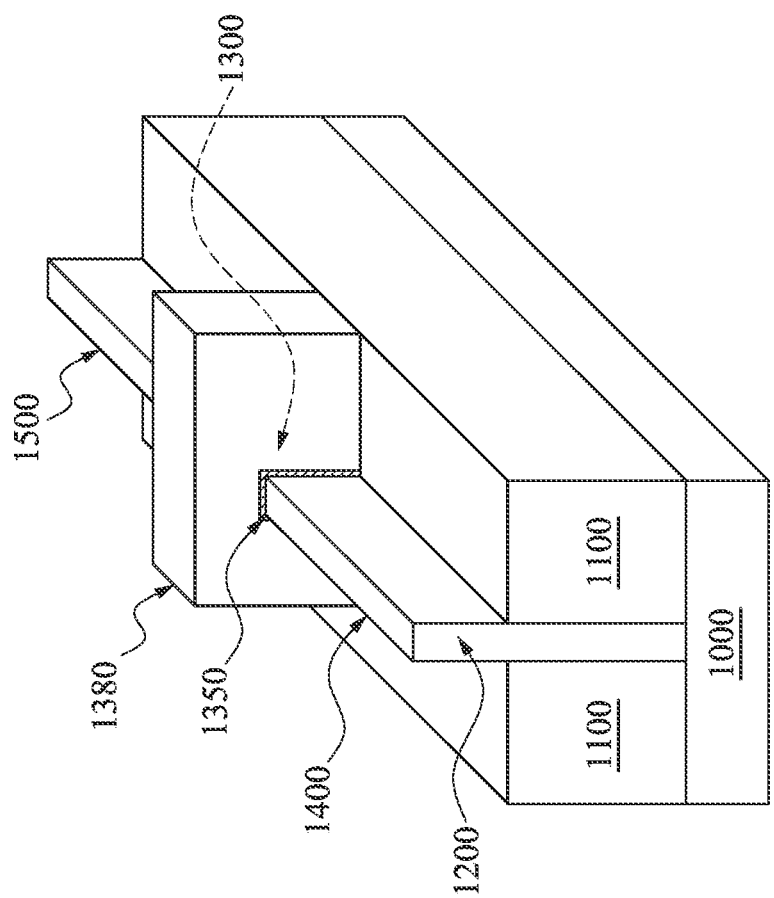
FIG. 2 is a perspective view of an exemplary fin field-effect transistor (FinFET).

FIG. 2 is a perspective view of a fin field-effect transistor (FinFET), which can be employed to implement various transistors of the standard cells described above. Referring to FIG. 2, a FinFET includes a semiconductor fin structure 1200 formed, for example, of silicon, protruding from a substrate 1000, for example, a silicon substrate. The semiconductor fin structure 1200 can be a trench-etched substrate or grown by epitaxy. A lower portion of the semiconductor fin structure 1200 is embedded in an isolation region 1100 formed over the substrate 1000. The isolation region 1100 is also called shallow trench isolation (STI).

The FinFET further includes a source region 1400 and a drain region 1500 and a channel region 1300 interposed therebetween. The source region 1400, the drain region 1500, and the channel region 1300 of the FinFET are made of an upper portion of the semiconductor fin structure 1200 at a level above the isolation regions 1100. The source and drain regions 1400 and 1500 are heavily doped and may contain impurities having a concentration in a range from about $5\times10^{19}$ to $1\times10^{20}$ cm$^{-3}$, while the channel region 1300 is undoped or lightly doped. In some embodiments, the source and drain regions of the fin structure 1200 are recessed to or below the upper surface of the isolation region 1100 and one or more semiconductor layers are epitaxially formed on the recessed fin structures.

A gate electrode 1380 is made of one or more layers of metal material, such as W, or Co, and may further include other work function adjusting metals, is formed over the channel region 1300, and extends to cover sidewalls of the channel region 1300 and to cover portions of the isolation regions 1100. The FinFET also has a gate insulating layer 1350 formed of, for example, a high-k dielectric material such as a metal oxide including oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixture thereof. The gate insulating layer 1350 is interposed between the gate electrode 1380 and the channel region 1300 to electrically isolate them from each other.

It should be appreciated that metal contacts can be formed over the source and drain regions 1400 and 1500, and/or a gate layer contact can be formed over the gate electrode 1380, to electrically connect the source and drain regions 1400 and 1500, and/or the gate electrode 1380 to various metal layers.

FIG. 3 shows a cross sectional view illustrating a vertical layer arrangement of a semiconductor device relating to the embodiments of the present disclosure. FIG. 3 does not necessarily show a specific cross section of the semiconductor device 10 described with respect to FIG. 1.

In the substrate layer the fin structures and source/drain structures are disposed. In the gate layer, gate structures including gate electrodes and gate dielectric layers are disposed. The local interconnect wiring layer M0 is located above the gate layer and/or the source/drain structures. In the first via layer located over the gate contact layer, first vias are disposed. In the first metal layer M1, the first metal wirings are disposed. In the second via layer, the second vias are disposed. In the second metal layer M2, second metal wirings are disposed. As set forth above, the first power supply wiring V1 and the second power supply wiring V2 are formed by a metal layer disposed in the first metal layer M1 as shown in FIG. 3. The number of metal layers (x for Mx) can be more than 2, and in some embodiments, up to 15-20. The metal layer M1 and above are made of metal, such as Cu, Al, or an alloy thereof with one or more thin conductive layers (e.g., Ta, Ti, TiN and/or TaN), and the local interconnect wiring M0 is made of different material than the metal layer M1 and above and includes Ni, Co, W, M0, an alloy thereof with one or more thin conductive layers (e.g., Ta, Ti, TiN and/or TaN), in some embodiments.

As the minimum dimension of the semiconductor devices become smaller and smaller in the order of nanometers, the cell height of the standard cells should also be reduced. As set forth above, the cell height of the standard cells is at least partially determined by the number of active fin structures. However, at least one fin structure is necessary for the p-type region and the n-type region, the minimum number of active fin structures is two, which corresponds to the number of virtual lines along which the active fin structures are aligned. On the other hand, some of the standard cells require two or more active fin structures for the p-type region and the n-type region, which increases the cell height. For example, to increase a drive current, two or more active fin structures per FinFET may be required. In the present disclosure, the term "height" used in connection with a standard cell (e.g., "cell height" or a "height of standard cells") generally refers to a dimension (length or distance) along the column direction in a plan view.

In embodiments of the present disclosure, the semiconductor device includes standard cells arranged with mixed cell heights. More specifically, a plurality of standard cells include a first group of standard cells arranged in a first row extending in the row direction and a second group of standard cells arranged in a second row extending in the row direction, which are arranged in the column direction. A cell height of the first group of standard cells in the column direction is different from a cell height of the second group of standard cells in the column direction.

Figure 4:
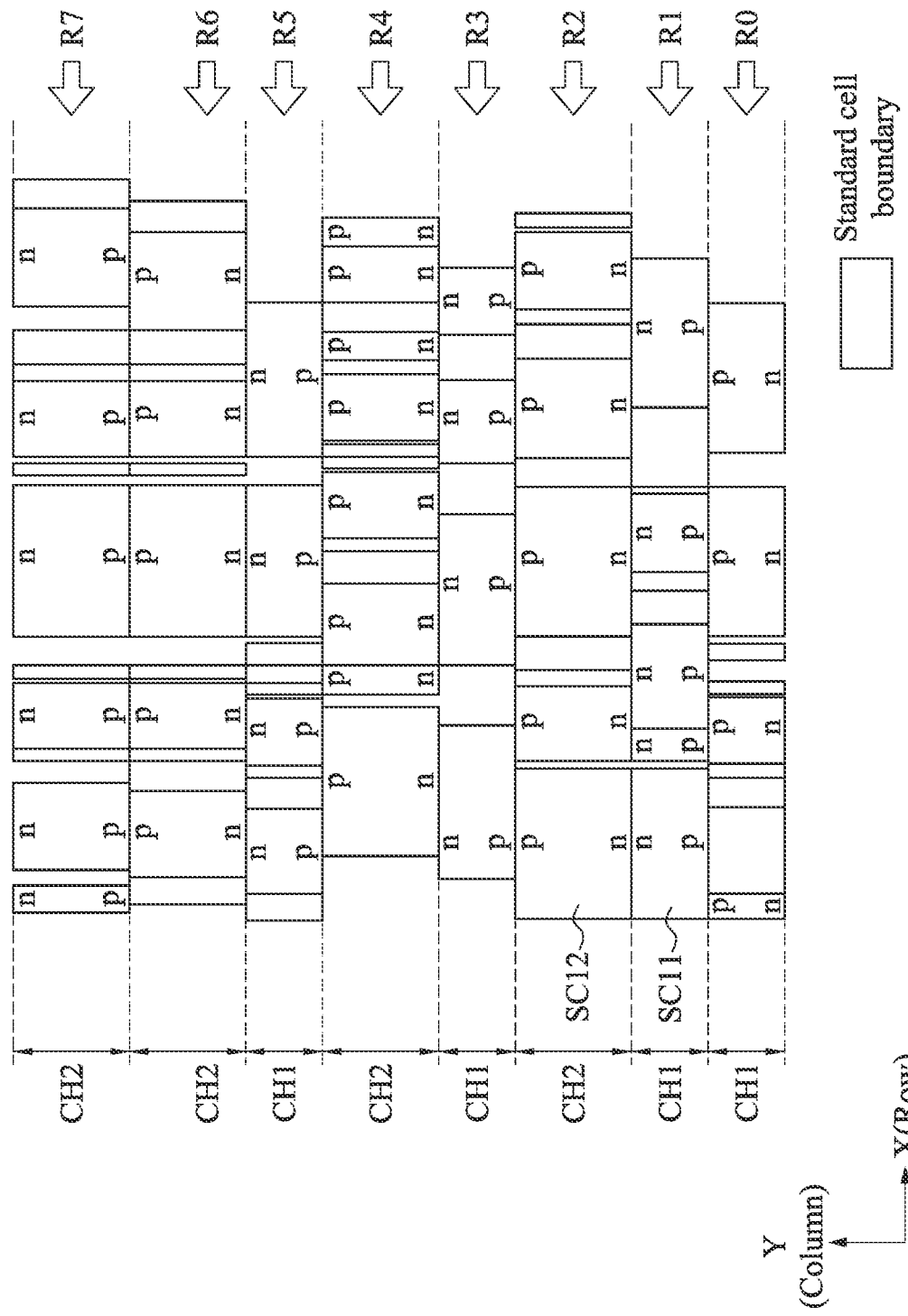
FIG. 4 shows a schematic layout in which standard cells are arranged in a row direction and a column direction according to embodiments of the present disclosure.

FIG. 4 shows a schematic layout in which standard cells are arranged in a row direction and a column direction according to embodiments of the present disclosure. Materials, configurations, layouts, dimensions, processes and/or operations same as or similar to those described with respect to FIGS. 1-3 may be employed in the following embodiments and the detailed explanation may be omitted.

The standard cell layout shown in FIG. 4 includes eight rows R0-R7 arranged in the column direction. Each row includes a plurality of standard cells. As shown in FIG. 4, the standard cells in the rows R0, R1, R3 and R5 have a first cell height CH1, and the standard cells in the rows R2, R4, R6 and R7 have a second cell height CH2 different from the first cell height CH1. For example, the standard cells SC11 in the first row R1 have the first cell height CH1 and the standard cells SC12 in the second row R2 have the second cell height CH2. In the same row, the cell heights of the standard cells are the same. In some embodiments, the first cell height CH1 is smaller than the second cell height CH2 as shown in FIG. 4. In other embodiments, the first cell height CH1 is greater than the second cell height CH2.

As shown in FIG. 4, in some embodiments, the rows having the first cell heights CH1 and the rows having the second cell heights CH2 are alternately arranged in the column direction (e.g., rows R1-R6). In other embodiments, two or more rows having the same cell height are arranged adjacent to each other in the column direction (e.g., rows R0 and R1 or rows R6 and R7). As shown in FIG. 4, widths of the standard cells in one row may vary.

Further, as shown in FIG. 4, the standard cells are arranged such that the p-type regions (p) of the standard cells in a given row (e.g., row R2) and the p-type regions of the standard cells in the adjacent row (e.g., row R3) in the column direction are located between the n-type regions (n) of the standard cells in the given row (R2) and the n-type regions of the standard cells in the adjacent row (R3). Similarly, the n-type regions (n) of the standard cells in a given row (e.g., row R1) and the n-type regions of the standard cells in the adjacent row (e.g., row R2) in the column direction are located between the p-type regions (p) of the standard cells in the given row (R1) and the p-type regions of the standard cells in the adjacent row (R2).

As set forth above, the first power supply wires V1 are arranged at the boundaries between adjacent p-type regions (e.g., between row R2 and row R3) and the second power supply wiring V2 are arranged at the boundaries between adjacent n-type regions (e.g., between row R1 and row R2). Thus, the first power supply wires V1 and the second power supply wires V2 are alternately arranged in the column direction.

In some embodiments, adjacent standard cells in the same row are electrically connected by one or more layers of M0, M1, M2 . . . and Mx. In some embodiments, adjacent standard cells in the adjacent rows are electrically connected by one or more layers of M2 . . . and Mx. In other words, a metal layer the same as or below the power supply wirings is not used to electrically connect adjacent standard cells in the adjacent rows across the power supply wiring in some embodiments.

If the cell heights of the standard cells are uniform, the cell height should be set at the larger cell height. In the case of FIG. 4, the cell heights of the all rows would be the second cell height CH2. In contrast, by employing the mixed cell height layout, the total height along the column direction of the standard cell layout can be reduced.

FIGS. 5A-7B show relationships between a cell height and a number of fin structures. Materials, configurations, layouts, dimensions, processes and/or operations same as or similar to those described with respect to FIGS. 1-4 may be employed in the following embodiments and the detailed explanation may be omitted.

Due to the minimum patterning resolution, a pitch of fin structures along the column direction is limited by design rules. Further, in some cases, one or more dummy fin structures which do not function as a part of FinFET or any other active electrical devices, are provided to improve patterning capability in the forming of fin structures.

FIG. 5A shows a minimum cell height case when using FinFETs for a standard cell. As set forth above, since a CMOS logic is employed, at least one active fin structure is required for each of a p-type region and an n-type region. As shown in FIG. 5A, two active fin structures AF are provided with a pitch FP1 in a standard cell. As set forth above, the number of fin structures corresponds to the number of virtual lines along which the active fin structures are aligned. In some embodiments, the fin pitch FP1 of the active fin structures AF is equal to the minimum design rule for fin structures. Further, as set forth above, two dummy fin structures DF are provided so that the active fin structures AF are located between two dummy fin structures DF in the column direction. A pitch FP2 between the active fin structure AF and the adjacent dummy fin structure DF is equal to the active fin pitch FP1 in some embodiments. In other embodiments, the dummy fin pitch FP2 is greater than the active fin pitch FPL. In some embodiments, the dimension of the dummy fin structures, e.g., a length in the row direction, a width in the column direction and/or a height from the substrate (see, FIG. 2) is different from the dimension of the active fin structures. In some embodiments, as shown in FIG. 5A, the dummy fin structures DF are disposed below the first and second power supply wirings V1 and V2, respectively. In other embodiments, the dummy fin structure DF partially overlaps or does not overlap the power supply wiring. As shown in FIG. 5A, the cell height CH1 is FP1+2FP2 and if FP1=FP2, the cell height CH1 is 3FP1. Thus, the cell height of a standard cell is determined by the number of active and dummy fin structures and their pitch.

FIG. 5B shows another embodiment when using FinFETs for a standard cell. Configurations, layouts and/or dimensions the same as or similar to the embodiment explained with respect to FIG. 5A may be employed in the following embodiments and the detailed explanation may be omitted. In the embodiment of FIG. 5B, a third dummy fin structure DF is provided between two active fin structures AF. A pitch between the third dummy fin structure and the active fin structures is FP3, which is the same as the pitch FP1 in some embodiments. Further, a pitch FP4 between the active fin structure AF and the dummy fin structure DF other than the third dummy fin structure is equal to the fin pitch FP3 in some embodiments. As shown in FIG. 5B, the cell height CH2 is 2FP3+2FP4 and if FP3=FP4, the cell height CH2 is 4FP3. Thus, the cell height of a standard cell is determined by the number of active and dummy fin structures and their pitch. When FP1=FP3, the cell height CH2 is 4FP1, and when the standard cell shown in FIG. 5A and the standard cell FIG. 5B are included in the semiconductor device (stacked in the column direction as shown in FIG. 4), CH1:CH2=3:4.

FIG. 6A shows another embodiment when using FinFETs for a standard cell. Configurations, layouts and/or dimensions the same as or similar to the embodiment explained with respect to FIGS. 5A and 5B may be employed in the following embodiments and the detailed explanation may be omitted. In the embodiment of FIG. 6A, two active fin structures are provided in each of the p-type region and the n-type region. A pitch between the active fin structures is FP1 in some embodiments. Further, a pitch FP2 between the active fin structure and the adjacent dummy fin structure is equal to the fin pitch FP1 in some embodiments. As shown in FIG. 6B, the cell height CH3 is 3FP1+2FP2 and if FP1=FP2, the cell height CH3 is 5FP1. Thus, the cell height of a standard cell is determined by the number of active and dummy fin structures and their pitch. When the standard cell shown in FIG. 5A and the standard cell FIG. 6A are included in the semiconductor device, CH1:CH3=3:5.

FIG. 6B shows another embodiment when using FinFETs for a standard cell. Configurations, layouts and/or dimensions the same as or similar to the embodiment explained with respect to FIGS. 5A-6A may be employed in the following embodiments and the detailed explanation may be omitted. In the embodiment of FIG. 6B, a third dummy fin structure is provided between two center active fin structures. Two active fin structures are arranged with a pitch FP1, and a pitch between the third dummy fin structure and the adjacent active fin structures is FP3, which is the same as the pitch FP1 in some embodiments. Further, a pitch FP4 between the active fin structure and the dummy fin structure other than the third dummy fin structure is equal to the fin pitch FP3 in some embodiments. As shown in FIG. 6B, the cell height CH4 is 2FP1+2FP3+2FP4 and if FP1=FP3=FP4, the cell height CH4 is 6FP1. Thus, the cell height of a standard cell is determined by the number of active and dummy fin structures and their pitch. When the standard cell shown in FIG. 5A and the standard cell FIG. 6B are included in the semiconductor device (stacked in the column direction as shown in FIG. 4), CH1:CH4=3:6=1:2.

Figure 7A:
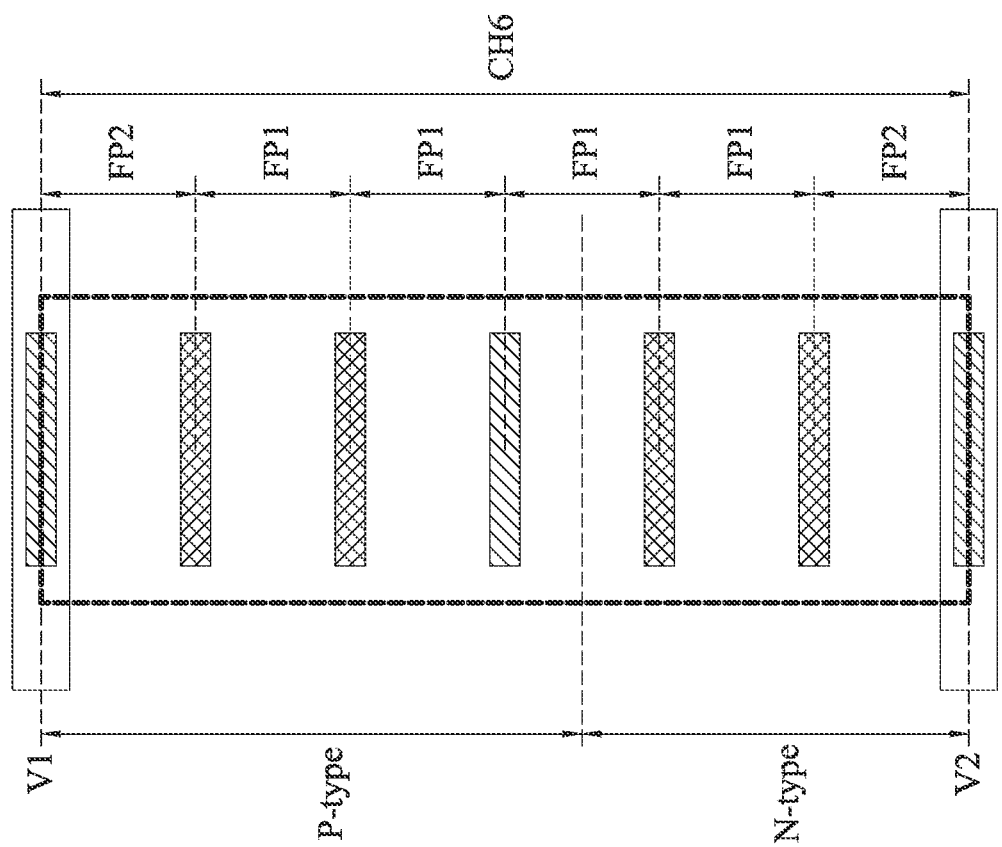
FIGS. 7A and 7B show standard cell structures according to embodiments of the present disclosure.
Figure 7B:
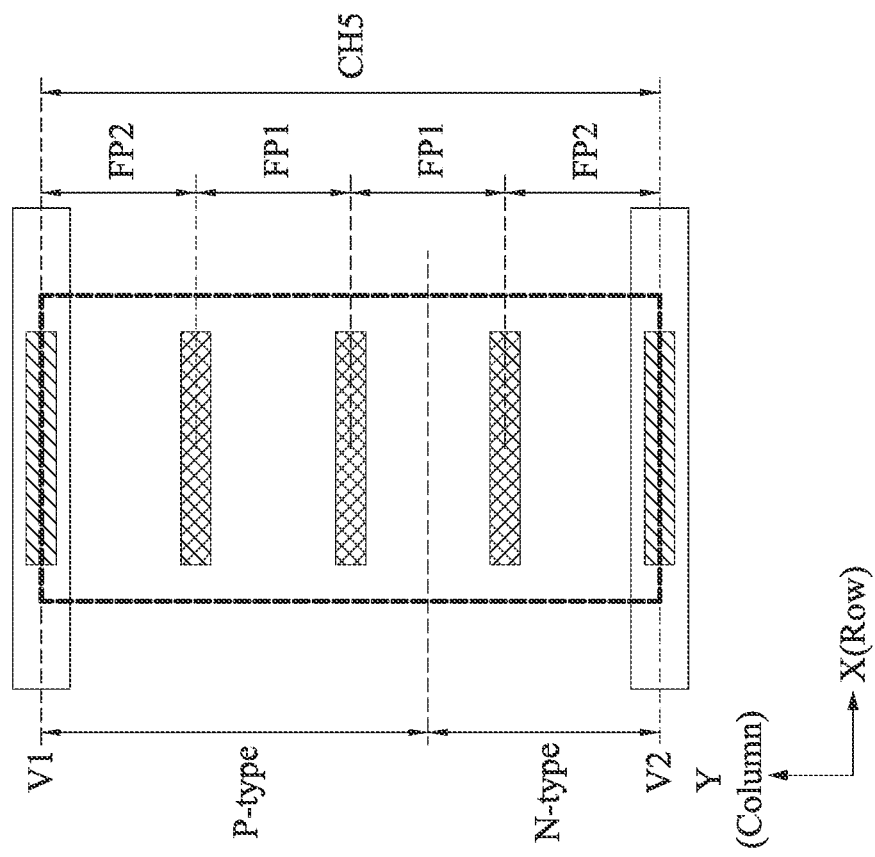

FIGS. 7A and 7B show other embodiments when using FinFETs for a standard cell. Configurations, layouts and/or dimensions the same as or similar to the embodiment explained with respect to FIGS. 5A-6B may be employed in the following embodiments and the detailed explanation may be omitted. In the embodiment of FIGS. 7A and 7B, the number of active fin structures in the p-type region and the number of active fin structures in the n-type region are different from each other. As shown in FIG. 7A, two active fin structures are provided in the p-type region, while one active fin structure is provided in the n-type region. A pitch between the active fin structures is FP1, and a pitch FP2 between the active fin structure and the adjacent dummy fin structure is equal to the fin pitch FP1 in some embodiments. As shown in FIG. 7A, the cell height CH5 is 2FP1+2FP2 and if FP1=FP2, the cell height CH3 is 4FP1. Thus, the cell height of a standard cell is determined by the number of active and dummy fin structures and their pitch. When the standard cell shown in FIG. 5A and the standard cell FIG. 7A are included in the semiconductor device, CH1:CH5=3:4. In some embodiments, similar to FIGS. 5B and 6B, a third dummy fin structure can be provided between the active fin structures in the p-type region and the active fin structure in the n-type region.

In FIG. 7B, three active fin structures are provided in the p-type region, while two active fin structures are provided in the n-type region. A pitch between the active fin structures is FP1, and a pitch FP2 between the active fin structure and the adjacent dummy fin structure is equal to the fin pitch FP1 in some embodiments. As shown in FIG. 7B, the cell height CH6 is 4FP1+2FP2 and if FP1=FP2, the cell height CH6 is 6FP1. Thus, the cell height of a standard cell is determined by the number of active and dummy fin structures and their pitch. When the standard cell shown in FIG. 5A and the standard cell FIG. 7B are included in the semiconductor device, CH1:CH5=3:6=1:2. In some embodiments, similar to FIGS. 5B and 6B, a third dummy fin structure can be provided between the active fin structures in the p-type region and the active fin structure in the n-type region.

The number of fin structures along the column direction is not limited to the above embodiments. Depending on the complexity of the functions realized by the standard cell and/or manufacturing process requirements, the number of the active and/or dummy fin structures is adjusted.

In the present embodiments, two or more standard cell structures shown in FIGS. 5A-7B are employed to perform functions of the semiconductor device. A ratio of the cell height of one group of standard cells in one row and the cell height of another group of standard cells in another row is N:M, where N and M are different natural numbers.

FIG. 8 shows a table illustrating combinations of various standard cells having different numbers of active fin structures. Cases 1-9 show embodiments in which the cell height of one row and a cell height of the adjacent row are different, and cases 10 and 11 show embodiments in which the cell height of one row and a cell height of the adjacent row are the same. Other combinations and/or other numbers of fin structures are possible.

Figure 9:
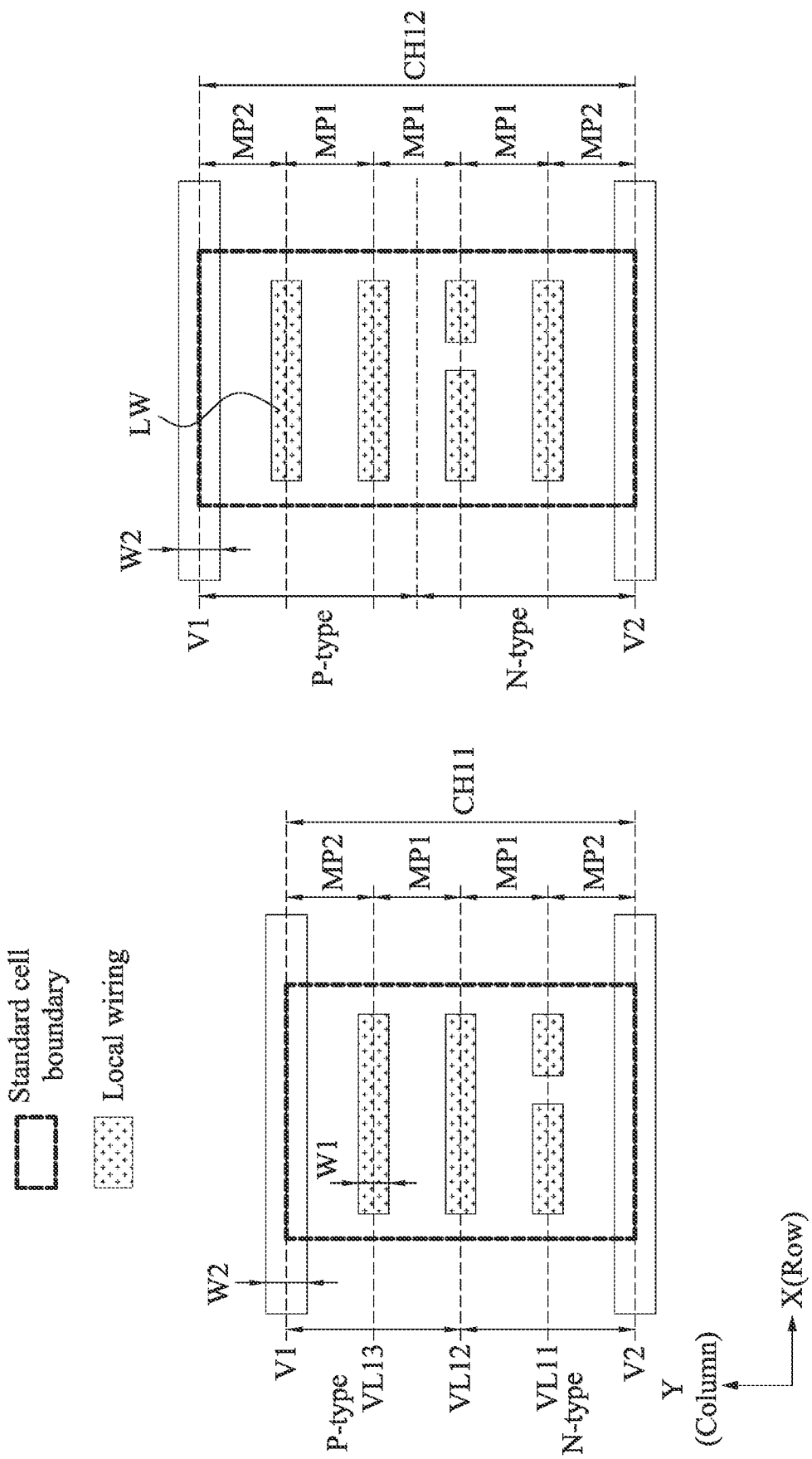
FIGS. 9A and 9B show standard cell structures according to embodiments of the present disclosure.

FIGS. 9A and 9B show standard cell structures according to other embodiments of the present disclosure.

The cell height of a standard cell is determined or limited not necessarily by the number and pitch of active and dummy fin structures and their pitch. Instead of, or in addition to the number of fin structures, the cell height of a standard cell is determined or limited by the number and pitch of the local interconnect wiring (M0) or the number and pitch of the M1 metal wirings, in the column direction. Similar to the number of the fin structures of a standard cell in the column direction, the number of metal wirings in a standard cell in the column direction is the number of virtual lines along which the metal wirings are aligned.

As shown in FIG. 9A, three local interconnect wirings LW are included in the column direction in one standard cell. As set forth above, the number of local interconnect wirings in the column direction is the number of virtual lines (e.g., VL11, VL12 and VL13) along which the metal wirings can be respectively aligned. Thus, in FIG. 9A, the number of local interconnect wirings in the column direction is three, although four wiring patterns are included in the standard cell.

In some embodiments, the local interconnect wirings LW are formed by the local interconnect layer M0, and in other embodiments, the local interconnect wirings LW are formed by the metal layer M1, while the power supply wirings V1 and V2 are formed by the metal layer M1.

As shown in FIG. 9A, a pitch of the local interconnect wirings LW in the column direction, which is a pitch of the virtual lines, is MP1, which is determined by the design rule set in view of the minimum patterning resolution. The pitch MP2 between the local interconnect wiring and the adjacent power supply wiring V1 or V2 is the same as the pitch MP1 in some embodiments, and is greater than the pitch MP 1 in other embodiments. The width W1 of the local interconnect wirings in the column direction is smaller than the width W2 of the power supply wirings in some embodiments. As shown in FIG. 9A, the cell height CH11 is 2MP1+2MP2 and if MP1=MP2, the cell height CH11 is 4MP1. Thus, the cell height of a standard cell is determined by the number of local interconnect wirings and their pitch.

In FIG. 9B, four local interconnect wirings (four virtual lines) are provided in a standard cell. As shown in FIG. 9B, the cell height CH12 is 3MP1+2MP2 and if MP1=MP2, the cell height CH11 is 5MP1. Thus, the cell height of a standard cell is determined by the number of local interconnect wirings and their pitch.

The number of the local interconnect wirings in the column direction is not limited to the embodiments of FIGS. 9A and 9B. The number can be two or more than three. When the standard cell shown in FIG. 9A and the standard cell FIG. 9B are included in the semiconductor device, CH11:CH12=4:5. Similar to the embodiments with respect to FIGS. 5A-7B, a ratio of the cell height of one group of standard cells in one row and the cell height of another group of standard cells in another row is N:M, where N and M are different natural numbers.

In some embodiments, the cell height is limited or determined by the number of fin structures and in other embodiments, the cell height is limited or determined by the number of local interconnect wirings. In other words, the cell height is a smaller cell height determined by the number and pitch of fin structures or by the number and pitch of the local interconnect wirings.

Figure 10:
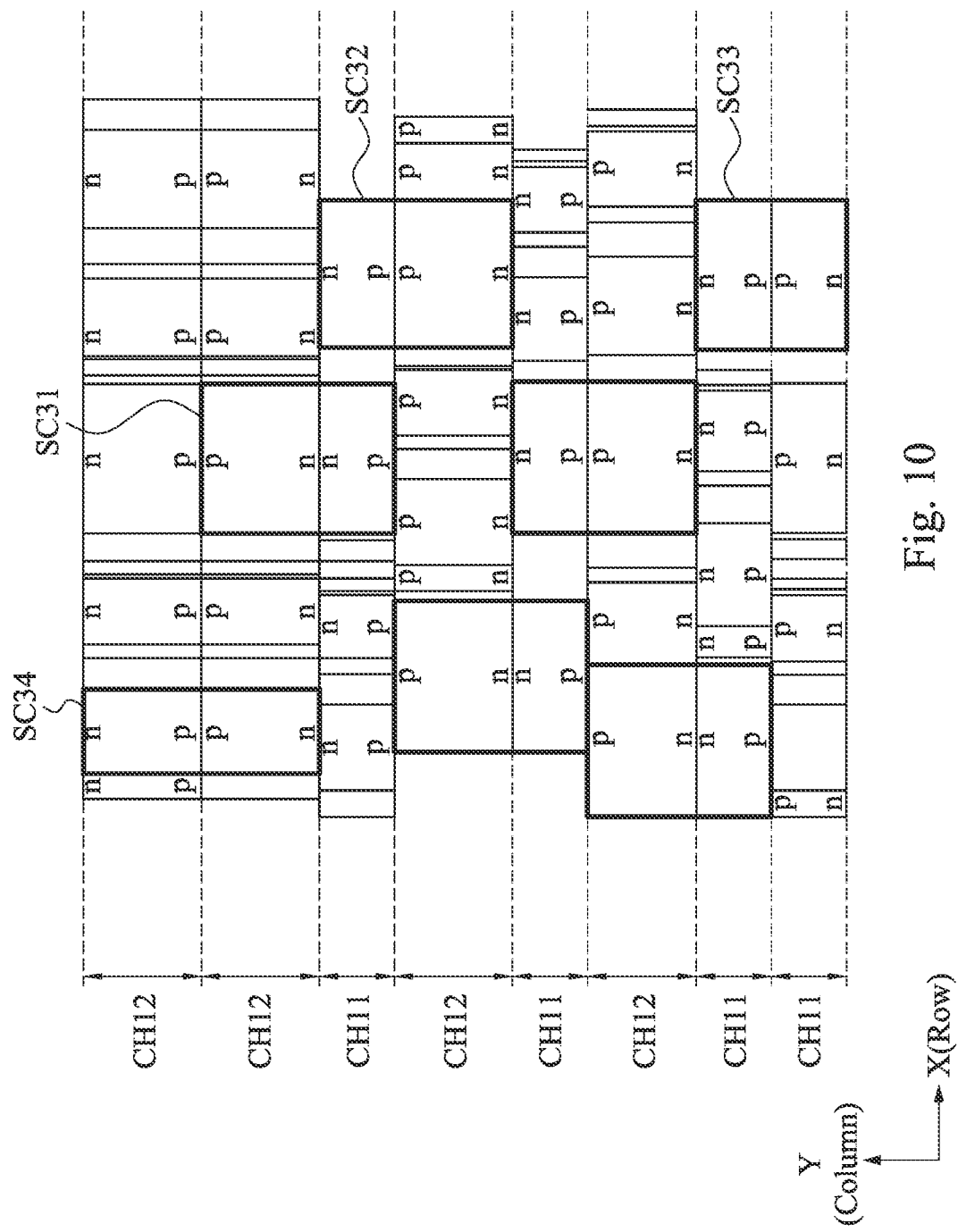
FIGS. 10 and 11 show schematic layouts in which standard cells are arranged in a row direction and a column direction according to other embodiments of the present disclosure.
Figure 11:
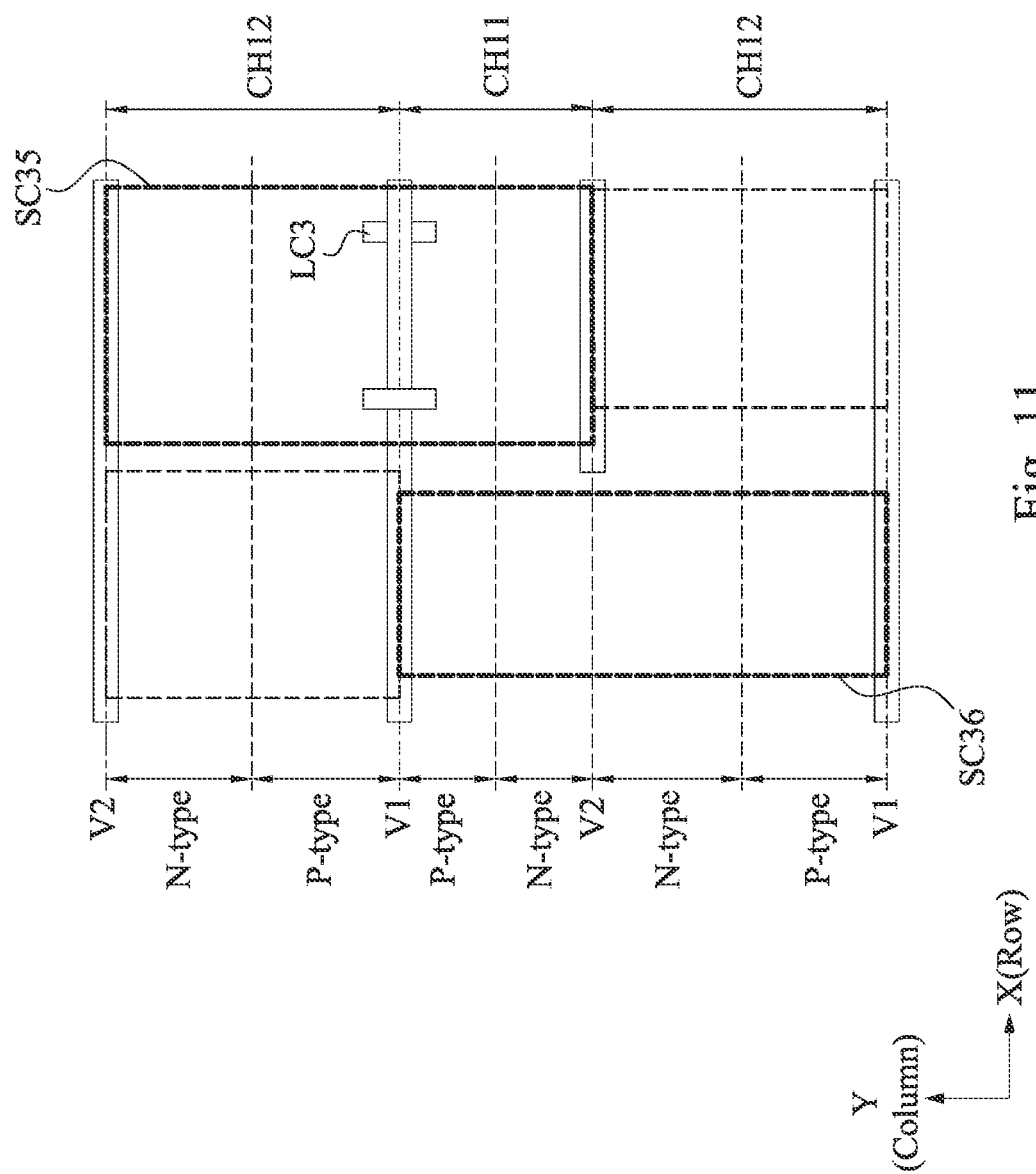
Figure 12:
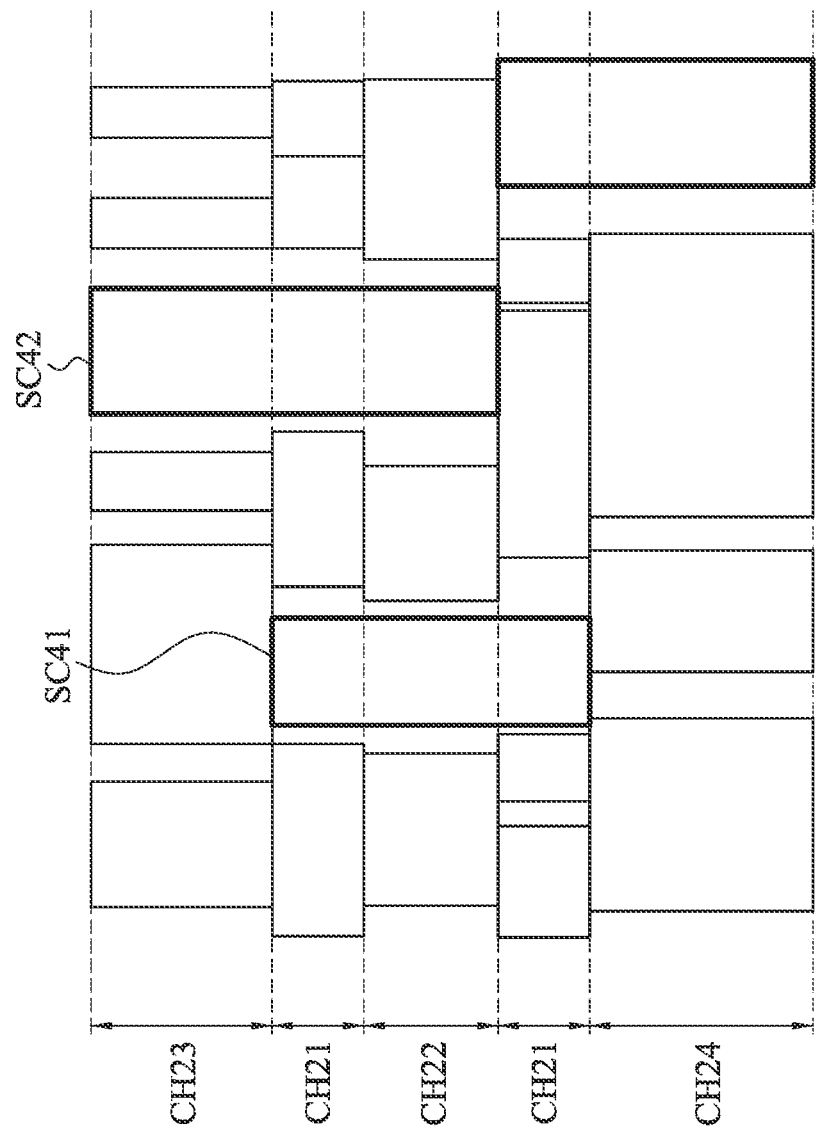
FIG. 12 shows a schematic layout in which standard cells are arranged in a row direction and a column direction according to other embodiments of the present disclosure.

FIGS. 10-12 show schematic layouts in which standard cells are arranged in a row direction and a column direction according to other embodiments of the present disclosure. Materials, configurations, layouts, dimensions, processes and/or operations same as or similar to those described with respect to FIGS. 1-9 may be employed in the following embodiments and the detailed explanation may be omitted.

In FIG. 10, similar to FIG. 4, two types of groups of standard cells having different cell heights CH11 and CH12 are arranged in respective rows of the standard cell structure of a semiconductor device. However, in FIG. 10, one or more standard cells having a cell height greater than CH11 and CH12 are disposed. More specifically, one or more combined standard cells having a cell height CH11+CH12, 2CH11 and/or 2CH12 are provided over two adjacent rows.

For example, a combined standard cell SC31 is disposed over the row having a cell height CH11 and the adjacent row having a cell height CH12 and thus has a cell height CH11+CH12. Similarly, a combined standard cell SC32 is disposed over the row having a cell height CH11 and the adjacent row having a cell height CH12 and thus has a cell height CH11+CH12. Further, a combined standard cell SC33 is disposed over the adjacent rows having a cell height CH11 and thus has a cell height 2CH11, and a combined standard cell SC34 is disposed over the adjacent rows having a cell height CH12 and thus has a cell height 2CH12.

The combined standard cells have their own intended circuit functionalities. In some embodiments, a combined standard cell SC 35 shown in FIG. 11 includes three power supply wirings, two of which are disposed on top and bottom of the combined standard cell SC35 and shared by the adjacent rows and one power supply line passing the middle of the combined standard cell SC35, thereby dividing the combined standard cell SC35 into an upper part and a lower part. Further, in some embodiments, one or more circuit elements in the region (e.g., a p-type region) of the upper part and one or more circuit elements in the region (e.g., a p-type region) of the lower part of the combined standard cell SC35 are electrically connected by one or more local interconnect wirings LC3 formed by the M0 layer located below the middle power supply wiring. In addition or in the alternative, one or more circuit elements in the region (e.g., a p-type region) of the upper part and one or more circuit element in the region (e.g., a p-type region) of the lower part of the combined standard cell SC35 are electrically connected by one or more metal wirings formed by M1, M2, . . . and/or Mx layers.

In certain embodiments, a combined standard cell SC 36 shown in FIG. 11 includes two power supply wirings which are disposed on top and bottom of the combined standard cell SC35 and shared by the adjacent rows and no middle power supply line passing the middle of the combined standard cell SC36.

By allowing one or more combined standard cells having a cell height greater than cell heights of the rows in the standard cell structure, it is possible to utilize standard cells having more complex circuit functionalities and thus increase flexibility and reduce complexity of circuit design. Further, by utilizing a combined standard cell, a standard cell having a long width disposed in one row can be reformed into a combined standard cell disposed over two rows but having a shorter width, which can decrease the total area of the standard cell structure. In other words, realizing a circuit function by a standard cell disposed in one row and a combined standard cell disposed over two or more rows can increase flexibility of the circuit design and can reduce the total area of the standard cell structure.

FIG. 12 shows a schematic layout in which standard cells are arranged in a row direction and a column direction according to other embodiments of the present disclosure. Similar to FIGS. 4, 9 and 10, the standard cell structure shown in FIG. 12 includes two or more (three) groups of standard cells having different (three) cell heights. Further, a combined standard cell SC41 disposed over three rows including standard cells having cell heights CH 21 and CH22, respectively, and another combined standard cell SC42 disposed over three rows including standard cells having cell heights CH 21, CH22 and CH23.

In the forgoing embodiments, relatively simple logic gates, such as an AND gate, an OR gate, an XOR gate, a NOT gate (invertor), a NAND gate, a NOR gate, and/or an XNOR gate are realized by the smallest height standard cells, and a combinational logic circuit such as a multiplexer, an AND-OR-Invert (AOI) logic and/or an OR-AND-Invert (OAI) logic are realized by the standard cells having cell heights higher than those for simple logic gates.

According to embodiments of the present disclosure, a semiconductor device having a standard cell structure including a plurality of standard cells can be designed by the following manner. For example, a standard cell library is prepared. The standard cell library includes standard cells having various circuit functionalities, respectively. The standard cells have various cell heights as set forth above. In some embodiments, the same circuit function is realized by different standard cells having different cell heights. According to the desired total circuit function, necessary standard cells are selected from the standard cell library. Then, the selected standard cells are grouped based on their cell heights, and the standard cells are arranged in rows having heights corresponding cell heights. Then, metal wirings connecting the standard cells are provided. If there is a space between adjacent standard cells along the row direction, one or more dummy structures (e.g., dummy gate electrodes) are provided. The designing is performed by using EDA (Electronic Desgin Automation) or ECAD (Electronic Computer-Aided Design) tools.

It will be understood that not all advantages have been necessarily discussed herein, no particular advantage is required for all embodiments or examples, and other embodiments or examples may offer different advantages.

According to one aspect of the present disclosure, a semiconductor device includes a plurality of standard cells. The plurality of standard cells include a first group of standard cells arranged in a first row extending in a row direction and a second group of standard cells arranged in a second row extending in the row direction. The first group of standard cells and the second group of standard cells are arranged in a column direction. A cell height of the first group of standard cells in the column direction is different from a cell height of the second group of standard cells in the column direction. In one or more of the foregoing and following embodiments, each of the plurality of standard cells includes a first power supply wiring for supplying a first potential and a second power supply wiring for supplying a second potential different from the first potential, and a cell height of each of the plurality of standard cells is a distance in the column direction between a center line, extending in the row direction, of the first power supply wiring and a center line, extending in the row direction, of the second power supply wiring. In one or more of the foregoing and following embodiments, a ratio of the cell height of the first group of standard cells and the cell height of the second group of standard cells is N:M, where N and M are different natural numbers. In one or more of the foregoing and following embodiments, one of the first power supply wiring and the second power supply wiring of the first group of standard cells is shared by the second group of standard cells. In one or more of the foregoing and following embodiments, each of the plurality of standard cells includes active fin structures extending in the row direction, forming one or more fin field effect transistors (FinFETs). In one or more of the foregoing and following embodiments, in the first group of standard cells, the active fin structures are aligned with either one of only I virtual lines extending in the row direction, respectively, where I is a natural number of two or more. In one or more of the foregoing and following embodiments, in the second group of standard cells, the active fin structures are aligned with either one of only J virtual lines extending in the row direction, respectively, where J is a natural number of two or more and from I. In one or more of the foregoing and following embodiments, either of I or J is two. In one or more of the foregoing and following embodiments, each of the plurality of standard cells further includes one or more dummy fin structures extending in the row direction, not functioning as a FinFET. In one or more of the foregoing and following embodiments, one of the one or more dummy fin structures is located between two of the active fin structures, and the one of the one or more dummy fin structures and the two of the active fin structures are arranged with a constant pitch in the column direction. In one or more of the foregoing and following embodiments, each of the plurality of standard cells further includes dummy fin structures extending in the row direction not functioning as a FinFET, and one of the dummy fin structures is located under the first power supply wiring, and one of the dummy fin structures is located under the second power supply wiring. In one or more of the foregoing and following embodiments, at least one of a height and a width of the dummy fin structures is different from that of the active fin structures. In one or more of the foregoing and following embodiments, each of the plurality of standard cells has a p-type device region and an n-type device region, and the first group of standard cells and the second group of standard cells are arranged in the column direction such that the p-type region of the first group of standard cells and the p-type region of the second group of standard cells are located between the n-type region of the first group of standard cells and the n-type region of the second group of standard cells. In one or more of the foregoing and following embodiments, each of the plurality of standard cells includes active fin structures extending in the row direction forming one or more fin field effect transistors (FinFETs), and in the first group of standard cells, a number of the active fin structures included in the p-type region is different from a number of the active fin structures included in the n-type region. In one or more of the foregoing and following embodiments, in the second group of standard cells, a number of the active fin structures included in the p-type region is equal to a number of the active fin structures included in the n-type region. In one or more of the foregoing and following embodiments, each of the plurality of standard cells includes metal wirings extending in the row direction, and located at a level closer to a substrate than a level at which the first and second power supply wirings are located. In one or more of the foregoing and following embodiments, in the first group of standard cells, the metal wirings are aligned with either one of only K virtual lines extending in the row direction, respectively, where K is a natural number of two or more. In one or more of the foregoing and following embodiments, in the second group of standard cells, the metal wirings are aligned with either one of only L virtual lines extending in the row direction, respectively, where L is a natural number of two or more and different from K.

In accordance with another aspect of the present disclosure, a semiconductor device includes a plurality of standard cells. The plurality of standard cells include a first group of standard cells arranged in a first row extending in a row direction and a second group of standard cells arranged in a second row extending in the row direction. The first group of standard cells and the second group of standard cells are arranged in a column direction. A cell height of the first group of standard cells in the column direction is different from a cell height of the second group of standard cells, and the cell height of the first group of standard cells and the cell height of the second group of standard cells are determined based on a number of fin structures arranged along the column direction within each of plurality of standard cells.

In accordance with another aspect of the present disclosure, a semiconductor device includes a plurality of standard cells. The plurality of standard cells include a first group of standard cells arranged in a first row extending in a row direction and a second group of standard cells arranged in a second row extending in the row direction. The first group of standard cells and the second group of standard cells are arranged in a column direction. Each of the plurality of standard cells includes a first power supply wiring for supplying a first potential and a second power supply wiring for supplying a second potential different from the first potential. A cell height of the first group of standard cells in the column direction is different from a cell height of the second group of standard cells in the column direction, and the cell height of the first group of standard cells and the cell height of the second group of standard cells are determined based on a number of metal wirings arranged along the column direction within each of plurality of standard cells, the metal wirings being located at a level closer to a substrate than a level at which the first and second power supply wirings are located.

In accordance with another aspect of the present disclosure, a semiconductor device includes a plurality of standard cells. The plurality of standard cells include a first group of standard cells arranged in a first row extending in a row direction and a second group of standard cells arranged in a second row extending in the row direction, and a third standard cell. The first group of standard cells and the second group of standard cells are arranged in a column direction. A cell height of the first group of standard cells in the column direction is different from a cell height of the second group of standard cells, and the third standard cell is disposed over the first row and the second row. In one or more of the foregoing and following embodiments, each of the plurality of standard cells includes a first power supply wiring for supplying a first potential and a second power supply wiring for supplying a second potential different from the first potential, and a cell height of each of the plurality of standard cells is a distance in the column direction between a center line, extending in the row direction, of the first power supply wiring and a center line, extending in the row direction, of the second power supply wiring. In one or more of the foregoing and following embodiments, a ratio of the cell height of the first group of standard cells and the cell height of the second group of standard cells is N:M, where N and M are different natural numbers. In one or more of the foregoing and following embodiments, one of the first power supply wiring and the second power supply wiring of the first group of standard cells is shared by the second group of standard cells. In one or more of the foregoing and following embodiments, each of the plurality of standard cells includes active fin structures extending in the row direction, and forming one or more fin field effect transistors (FinFETs). In one or more of the foregoing and following embodiments, in the first group of standard cells, the active fin structures are aligned with either one of only I virtual lines extending in the row direction, respectively, where I is a natural number of two or more. In one or more of the foregoing and following embodiments, in the second group of standard cells, the active fin structures are aligned with either one of only J virtual lines extending in the row direction, respectively, where J is a natural number of two or more and different from I. In one or more of the foregoing and following embodiments, either of I or J is two. In one or more of the foregoing and following embodiments, each of the plurality of standard cells further includes one or more dummy fin structures extending in the row direction, not functioning as a FinFET. In one or more of the foregoing and following embodiments, one of the one or more dummy fin structures is located between two of the active fin structures, and the one of the one or more dummy fin structures and the two of the active fin structures are arranged with a constant pitch in the column direction. In one or more of the foregoing and following embodiments, each of the plurality of standard cells further includes dummy fin structures extending in the row direction, and not functioning as a FinFET, and one of the dummy fin structures is located under the first power supply wiring, and one of the dummy fin structures is located under the second power supply wiring. In one or more of the foregoing and following embodiments, at least one of a height and a width of the dummy fin structures is different from that of the active fin structures. In one or more of the foregoing and following embodiments, each of the plurality of standard cells has a p-type device region and an n-type device region, and the first group of standard cells and the second group of standard cells are arranged in the column direction such that the p-type region of the first group of standard cells and the p-type region of the second group of standard cells are located between the n-type region of the first group of standard cells and the n-type region of the second group of standard cells. In one or more of the foregoing and following embodiments, each of the plurality of standard cells includes active fin structures extending in the row direction, and forming one or more fin field effect transistors (FinFETs), and in the first group of standard cells, a number of the active fin structures included in the p-type region is different from a number of the active fin structures included in the n-type region. In one or more of the foregoing and following embodiments, in the second group of standard cells, a number of the active fin structures included in the p-type region is equal to a number of the active fin structures included in the n-type region. In one or more of the foregoing and following embodiments, each of the plurality of standard cells includes metal wirings extending in the row direction, and located at a level closer to a substrate than a level at which the first and second power supply wirings are located. In one or more of the foregoing and following embodiments, in the first group of standard cells, the metal wirings are aligned with either one of only K virtual lines extending in the row direction, respectively, where K is a natural number of two or more. In one or more of the foregoing and following embodiments, in the second group of standard cells, the metal wirings are aligned with either one of only L virtual lines extending in the row direction, respectively, where L is a natural number of two or more and different from K. In one or more of the foregoing and following embodiments, the third standard cell includes a first p-type region and a first n-type region disposed in the first row and a second p-type region and a second n-type region disposed in the second row. In one or more of the foregoing and following embodiments, a first circuit element in the first p-type region or first n-type region is connected to a second circuit element in the second p-type region or second n-type region by a local interconnect wiring disposed below one of the first and second power supply wirings.

In accordance with another aspect of the present disclosure, a semiconductor device includes a plurality of standard cells. The plurality of standard cells include a first group of standard cells arranged in a first row extending in a row direction, a second group of standard cells arranged in a second row extending in the row direction, and a third group of standard cells arranged in a third row extending in the row direction. The first group of standard cells, the second group of standard cells and the third group of standard cells are arranged in a column direction, and a cell height of the first group of standard cells in the column direction, a cell height of the second group of standard cells in the column direction and a cell height of the third group of standard cells in the column direction are different from each other. In one or more of the foregoing and following embodiments, each of the plurality of standard cells includes a first power supply wiring for supplying a first potential and a second power supply wiring for supplying a second potential different from the first potential, and a cell height of each of the plurality of standard cells is a distance in the column direction between a center line, extending in the row direction, of the first power supply wiring and a center line, extending in the row direction, of the second power supply wiring. In one or more of the foregoing and following embodiments, the plurality of standard cells include a fourth standard cell, and the fourth standard cell is disposed over at least two rows adjacent to each other. In one or more of the foregoing and following embodiments, a ratio of the cell height of the first group of standard cells, the cell height of the second group of standard cells and the cell height of the third group of standard cells is N:M:L, where N, M and L are different natural numbers. In one or more of the foregoing and following embodiments, each of the plurality of standard cells includes active fin structures extending in the row direction, and forming one or more fin field effect transistors (FinFETs). In one or more of the foregoing and following embodiments, in the first group of standard cells, the active fin structures are aligned with either one of only I virtual lines extending in the row direction, respectively, where I is a natural number of two or more. In one or more of the foregoing and following embodiments, in the second group of standard cells, the active fin structures are aligned with either one of only J virtual lines extending in the row direction, respectively, where J is a natural number of two or more and different from I. In one or more of the foregoing and following embodiments, in the third group of standard cells, the active fin structures are aligned with either one of only K virtual lines extending in the row direction, respectively, where K is a natural number of two or more and different from I and J. In one or more of the foregoing and following embodiments, each of the plurality of standard cells further includes one or more dummy fin structures extending in the row direction, and not functioning as a FinFET. In one or more of the foregoing and following embodiments, one of the one or more dummy fin structures is located between two of the active fin structures, and the one of the one or more dummy fin structures and the two of the active fin structures are arranged with a constant pitch in the column direction. In one or more of the foregoing and following embodiments, each of the plurality of standard cells further includes dummy fin structures extending in the row direction, not functioning as a FinFET, and one of the dummy fin structures is located under the first power supply wiring, and one of the dummy fin structures is located under the second power supply wiring. In one or more of the foregoing and following embodiments, at least one of a height and a width of the dummy fin structures is different from that of the active fin structures. In one or more of the foregoing and following embodiments, each of the plurality of standard cells has a p-type device region and an n-type device region, the first group of standard cells and the second group of standard cells are arranged in the column direction such that the p-type region of the first group of standard cells and the p-type region of the second group of standard cells are located between the n-type region of the first group of standard cells and the n-type region of the second group of standard cells, and the second group of standard cells and the third group of standard cells are arranged in the column direction such that the n-type region of the second group of standard cells and the n-type region of the third group of standard cells are located between the p-type region of the second group of standard cells and the p-type region of the third group of standard cells. In one or more of the foregoing and following embodiments, each of the plurality of standard cells includes active fin structures extending in the row direction, and forming one or more fin field effect transistors (FinFETs), and in at least one of the first, second and third groups of standard cells, a number of the active fin structures included in the p-type region is different from a number of the active fin structures included in the n-type region. In one or more of the foregoing and following embodiments, each of the plurality of standard cells includes metal wirings extending in the row direction, and located at a level closer to a substrate than a level at which the first and second power supply wirings are located. In one or more of the foregoing and following embodiments, in the first group of standard cells, the metal wirings are aligned with either one of only I virtual lines extending in the row direction, respectively, where I is a natural number of two or more. In one or more of the foregoing and following embodiments, in the second group of standard cells, the metal wirings are aligned with either one of only J virtual lines extending in the row direction, respectively, where J is a natural number of two or more and different from I. In one or more of the foregoing and following embodiments, in the third group of standard cells, the metal wirings are aligned with either one of only K virtual lines extending in the row direction, respectively, where K is a natural number of two or more and different from I and J.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device including a plurality of standard cells, wherein:
   the plurality of standard cells include:
   a first group of standard cells arranged in a first row extending in a first direction,
   wherein the first group of standard cells have a first cell height N in a second direction perpendicular to the first direction; and
   a second group of standard cells arranged in a second row extending in the first direction,
   wherein the second group of standard cells have a second cell height M in the second direction,
   N and M are different, and
   a ratio of N:M ranges from 0.33 to 1.67; and
   a third standard cell arranged along the second direction having a height in the second direction equal to N+M.

2. The semiconductor device of claim 1, wherein each of the plurality of standard cells includes a first power supply wiring for supplying a first potential and a second power supply wiring for supplying a second potential different from the first potential.

3. The semiconductor device of claim 2, wherein a cell height of each of the plurality of standard cells is a distance in the second direction between a center line, extending in the first direction, of the first power supply wiring and a center line, extending in the first direction, of the second power supply wiring.

4. The semiconductor device of claim 2, wherein one of the first power supply wiring and the second power supply wiring of the first group of standard cells is shared by the second group of standard cells.

5. The semiconductor device of claim 2, wherein each of the plurality of standard cells includes active fin structures extending in the first direction forming one or more fin field effect transistors (FinFETs).

6. The semiconductor device of claim 5, wherein each of the plurality of standard cells further includes one or more dummy fin structures not functioning as a FinFET extending in the first direction.

7. The semiconductor device of claim 6, wherein one of the one or more dummy fin structures is located between two of the active fin structures.

8. The semiconductor device of claim 7, wherein the one of the one or more dummy fin structures and the two of the active fin structures are arranged with a constant pitch in the second direction.

9. The semiconductor device of claim 6, wherein one of the dummy fin structures is located under the first power supply wiring, and one of the dummy fin structures is located under the second power supply wiring.

10. The semiconductor device of claim 6, wherein at least one of a height and a width of the dummy fin structures is different from that of the active fin structures.

11. A semiconductor device, comprising:
a plurality of first standard cells arranged along a first row in a first direction, wherein the plurality of first standard cells have a first height N along a second direction perpendicular to the first direction;
a plurality of second standard cells arranged along a second row in the first direction, wherein the plurality of second standard cells have a second height M along the second direction,
wherein a plurality of first rows of the plurality of first standard cells and a plurality of second rows of the plurality of second standard cells are alternately arranged along the second direction,
each of the first standard cells and the second standard cells include a first conductivity type region and a second conductivity type region arranged along the second direction,
a first conductivity type region in a row of the plurality of first standard cells is next to a first conductivity type region of an adjacent row of the plurality of second standard cells,
a second conductivity type region in the row of the plurality of first standard cells is next to a second conductivity type region of another adjacent row of the plurality of second standard cells, and
N and M are different heights.

12. The semiconductor device of claim 11, wherein each of the plurality of standard cells includes a first power supply wiring for supplying a first potential and a second power supply wiring for supplying a second potential different from the first potential.

13. The semiconductor device of claim 12, wherein a cell height of each of the plurality of standard cells is a distance in the second direction between a center line, extending in the first direction, of the first power supply wiring and a center line, extending in the first direction, of the second power supply wiring.

14. The semiconductor device of claim 12, wherein one of the first power supply wiring and the second power supply wiring of the plurality of first standard cells is shared by the plurality of second standard cells.

15. The semiconductor device of claim 11, wherein each of the plurality of standard cells includes active fin structures extending in the first direction forming one or more fin field effect transistors (FinFETs).

16. A semiconductor device, comprising:
a first plurality of standard cells arranged along a first row extending in a first direction,
wherein the first plurality of standard cells have a first height N along a second direction perpendicular to the first direction;
a second plurality of standard cells arranged along a second row extending in the first direction,
wherein the second plurality of standard cells have a second height M along the second direction;
a third plurality of standard cells arranged along a third row extending in the first direction,
wherein the third plurality of standard cells have a third height P along the second direction,
wherein the first row, second row, and third row are arranged along a second direction perpendicular to the first direction, and
N, M, and P are different; and
a fourth standard cell disposed over the first row, second row, and third row,
wherein the fourth standard cell has a height in the second direction equal to N+M+P.

17. The semiconductor device of claim 16, wherein each of the plurality of standard cells includes a first power supply wiring for supplying a first potential and a second power supply wiring for supplying a second potential different from the first potential.

18. The semiconductor device of claim 17, wherein a cell height of each of the plurality of standard cells is a distance in the second direction between a center line, extending in the first direction, of the first power supply wiring and a center line, extending in the first direction, of the second power supply wiring.

19. The semiconductor device of claim 17, wherein one of the first power supply wiring and the second power supply wiring of the plurality of first standard cells is shared by the plurality of second standard cells.

20. The semiconductor device of claim 17, wherein one of the first power supply wiring and the second power supply wiring of the plurality of first standard cells is shared by the plurality of third standard cells.

* * * * *